(12) United States Patent
Yang

(10) Patent No.: US 12,543,589 B2
(45) Date of Patent: Feb. 3, 2026

(54) SEMICONDUCTOR STRUCTURE AND METHOD FOR ARRANGING REDISTRIBUTION LAYER OF SEMICONDUCTOR DEVICE

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 427 days.

(21) Appl. No.: 18/201,319

(22) Filed: May 24, 2023

(65) Prior Publication Data

US 2024/0395762 A1    Nov. 28, 2024

(51) Int. Cl.
*H01L 23/00*    (2006.01)

(52) U.S. Cl.
CPC .............. *H01L 24/46* (2013.01); *H01L 24/16* (2013.01); *H01L 24/48* (2013.01); *H01L 24/73* (2013.01); *H01L 2224/1613* (2013.01); *H01L 2224/46* (2013.01); *H01L 2224/48091* (2013.01); *H01L 2224/48159* (2013.01); *H01L 2224/92127* (2013.01)

(58) Field of Classification Search
CPC .......... H01L 24/46; H01L 24/16; H01L 24/48
See application file for complete search history.

(56) References Cited

U.S. PATENT DOCUMENTS

| | | | |
|---|---|---|---|
| 2002/0011606 A1* | 1/2002 | Otake | H01L 23/3114 257/E21.022 |
| 2016/0379920 A1 | 12/2016 | Tang et al. | |
| 2021/0351162 A1 | 11/2021 | Yang | |
| 2022/0246559 A1 | 8/2022 | Tsai et al. | |

OTHER PUBLICATIONS

Office Action mailed on Jan. 17, 2024 related to Taiwanese Application No. 112125299.
Office Action and and the search report mailed on Dec. 16, 2024 related to Taiwanese Application No. 113108689.
Office Action and and the search report mailed on May 10, 2024 related to Taiwanese Application No. 112125299.

* cited by examiner

*Primary Examiner* — Errol V Fernandes
(74) *Attorney, Agent, or Firm* — Xuan Zhang

(57) ABSTRACT

A semiconductor device is provided, which includes a semiconductor die and a redistribution layer. The redistribution layer is formed on the semiconductor die, and includes a plurality of center pads, a plurality of edge pads, and a plurality of conductive wires electrically connecting the plurality of center pads to the plurality of edge pads. Each of the plurality of conductive wires comprises at least two turning points, and an inner angle at each turning point is greater than a predetermined angle.

19 Claims, 9 Drawing Sheets

SEMICONDUCTOR STRUCTURE AND METHOD FOR ARRANGING REDISTRIBUTION LAYER OF SEMICONDUCTOR DEVICE

TECHNICAL FIELD

The present disclosure relates to semiconductor devices, and more particularly, to a semiconductor device, a semiconductor structure, and a method for arranging a redistribution layer (RDL) of a semiconductor device.

DISCUSSION OF THE BACKGROUND

With advances in applied technology, semiconductor devices are smaller while providing increased functionality and more integrated circuitry. Accordingly, various types and dimensions of semiconductor devices performing multiple functions are being integrated and packaged into single modules, requiring a wide range of manufacturing operations.

Such manufacturing and integration of semiconductor devices involves complicated steps and operations, complicating integration of semiconductor devices into low-profile and high-density configurations. Commensurate increases in the complexity of manufacturing and integration can result in shortcomings such as poor electrical interconnection and interference.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device which includes a semiconductor die and a redistribution layer. The redistribution layer is formed on the semiconductor die, and includes a plurality of center pads, a plurality of edge pads, and a plurality of conductive wires electrically connecting the plurality of center pads to the plurality of edge pads. Each of the plurality of conductive wires comprises at least two turning points, and an inner angle at each turning point is greater than a predetermined angle.

Another aspect of the present disclosure provides a semiconductor structure, which includes a substrate, a semiconductor device, and a plurality of bonding wires. The substrate has a first surface and a conductive trace extending above the substrate. The semiconductor device is disposed on the first surface of the substrate, and includes a semiconductor die and a redistribution layer. The redistribution layer is formed on the semiconductor die, and includes a plurality of center pads, a plurality of edge pads, and a plurality of conductive wires electrically connecting the plurality of center pads to the plurality of edge pads. The plurality of bonding wires are electrically connected between the substrate and the plurality of edge pads. Each of the plurality of conductive wires comprises at least two turning points, and an inner angle at each turning point is greater than a predetermined angle.

Yet another aspect of the present disclosure provides a method for arranging a redistribution layer of a semiconductor device. The method includes the following steps: fabricating a semiconductor die on a semiconductor wafer; forming a redistribution layer on a top surface of the semiconductor die to obtain a semiconductor device, wherein the redistribution layer comprises a plurality of center pads and a plurality of edge pads; and redirecting the plurality of center pads to the plurality of edge pads via a plurality of conductive wires of the redistribution layer. Each conductive wire includes at least two turning points, and an inner angle at each turning point is greater than a predetermined angle.

The foregoing outlines rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
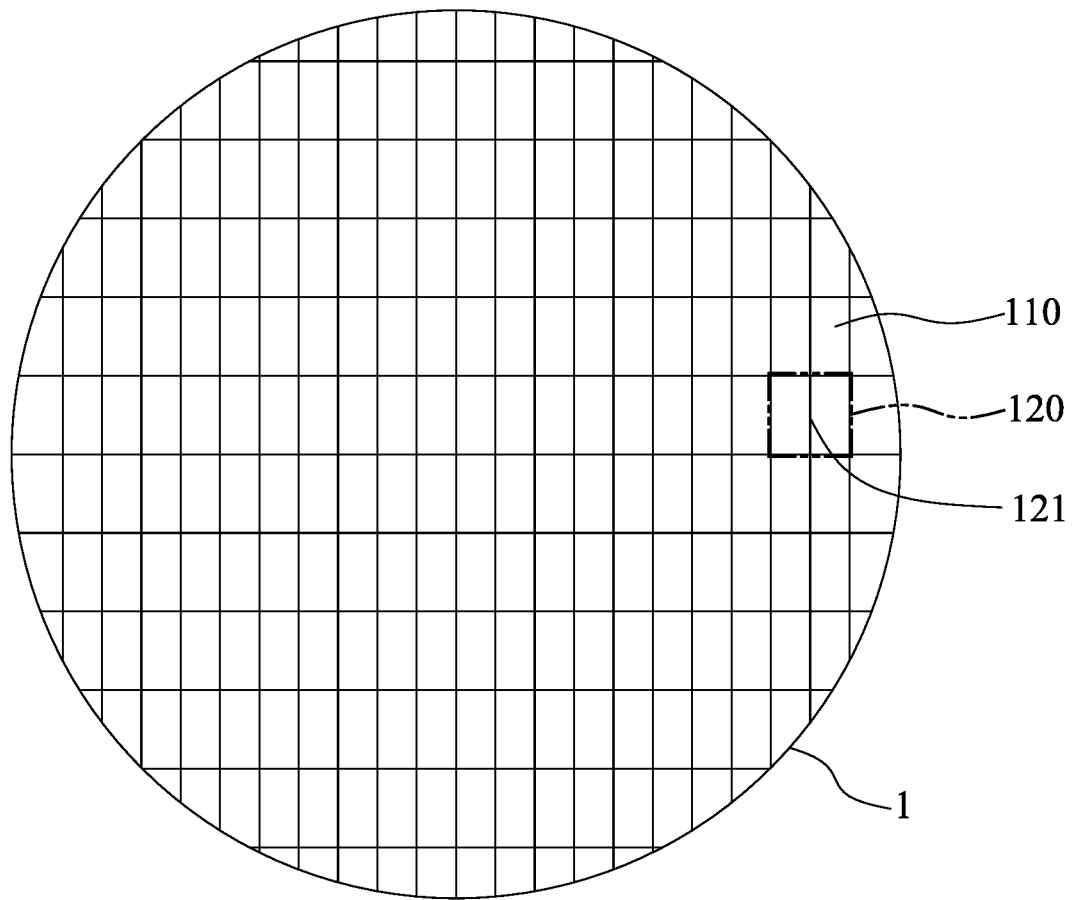
FIG. 1 is a top view of a semiconductor wafer 1 in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (for example, rotated 90° or at other orientations) and the spatially relative descriptors used herein interpreted accordingly. In addition, it will also be understood that when a layer is referred to as being "between" two layers, it can be the only layer between the two layers, or one or more intervening layers may also be present.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

FIG. 1 is a top view of a semiconductor wafer 1 in accordance with some embodiments of the present disclosure.

As shown in FIG. 1, the semiconductor wafer 1 includes a plurality of semiconductor dies 110, each surrounded by a scribe line region 121, such that every two adjacent semiconductor dies 110 are separated by the scribe line region 121. The scribe line region 121 is a non-functional region on the semiconductor wafer 1. In addition, one or more dicing paths may be defined on the scribe line region 121. In some embodiments, the dicing path may be from top to bottom and from left to right, or from bottom to top and from right to left, depending on the dicing equipment.

Specifically, a semiconductor chip or die (such as a memory chip) is typically fabricated on a single semiconductor wafer along with hundreds, and in some cases thousands, of copies of the same die. The cutting needed to separate individual dies from a semiconductor wafer, a process known as "dicing" or "wafer dicing", can be performed with a die saw (such as a diamond saw). Cuts are made along non-functional regions of semiconductor material, known as scribe lines (i.e., scribe line region 121), that separate the semiconductor dies 110 on the semiconductor wafer 1. Each of the semiconductor dies 110 may be fabricated into a semiconductor device (e.g., a memory chip) 200 shown in FIG. 2A, and more details will be described later.

Figure 2A:
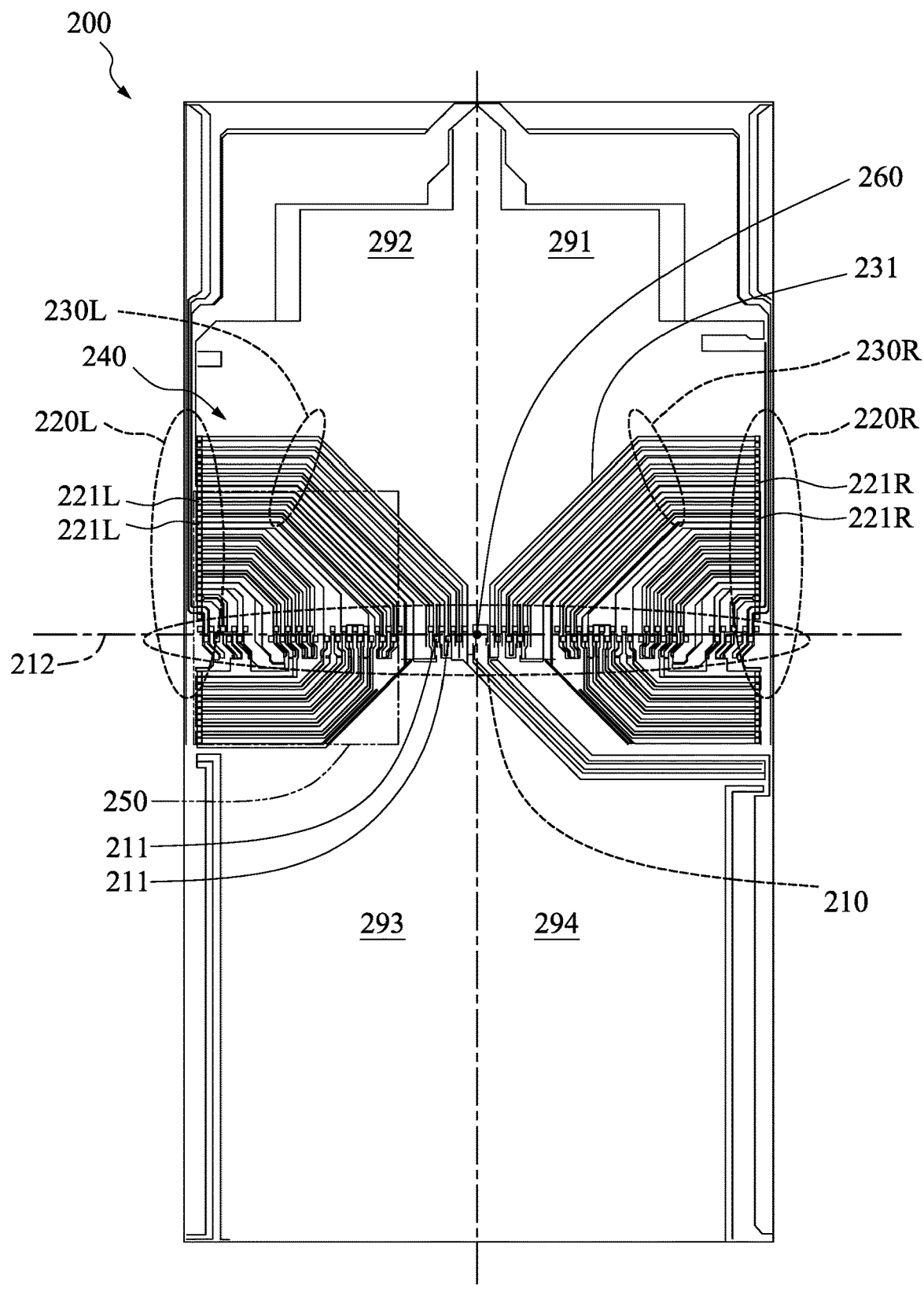
FIG. 2A is a top view of a semiconductor device 200 in accordance with an embodiment of the present disclosure.
Figure 2B:
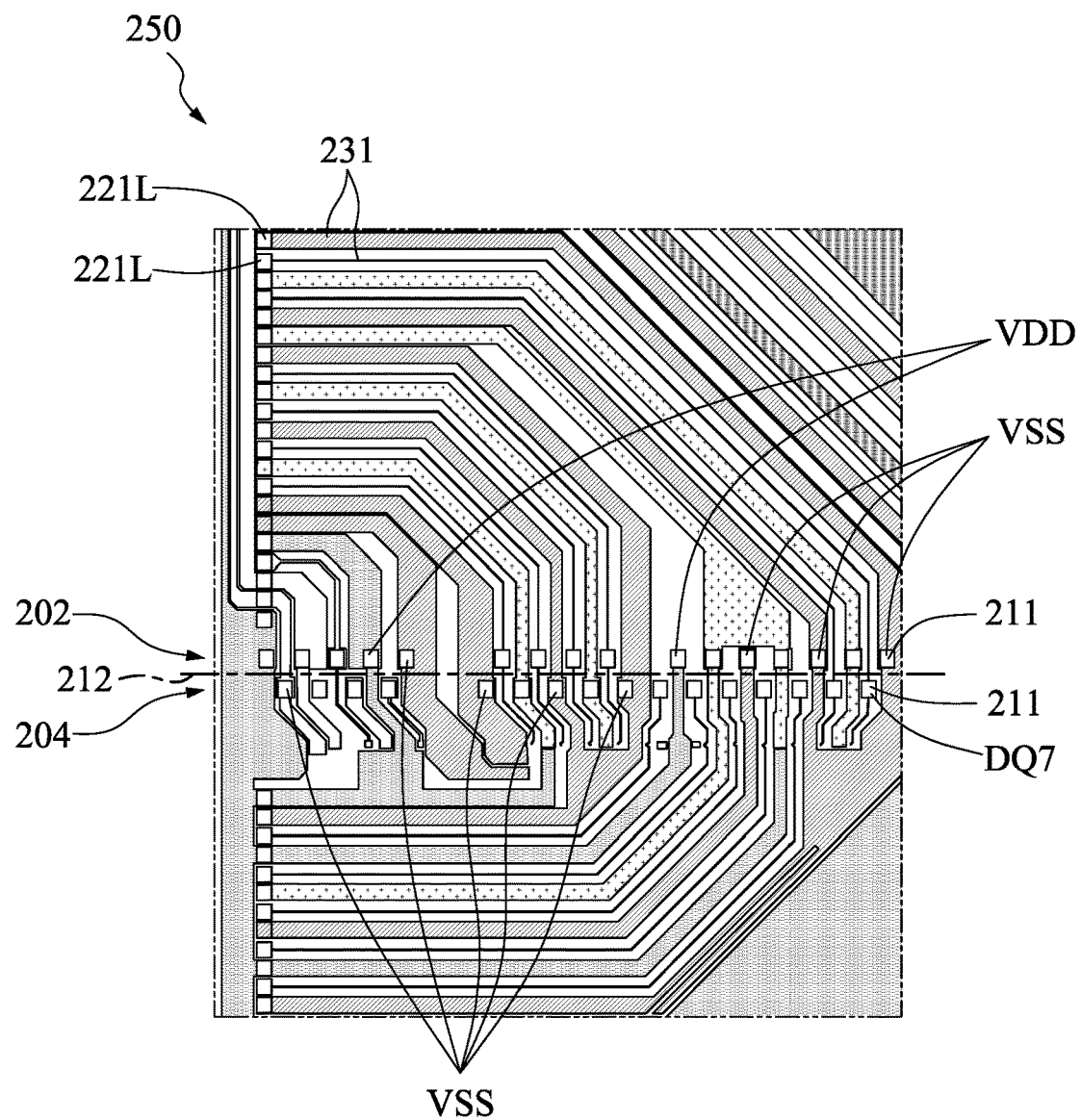
FIG. 2B is an enlarged view of region 250 in FIG. 2A.
Figure 2C:
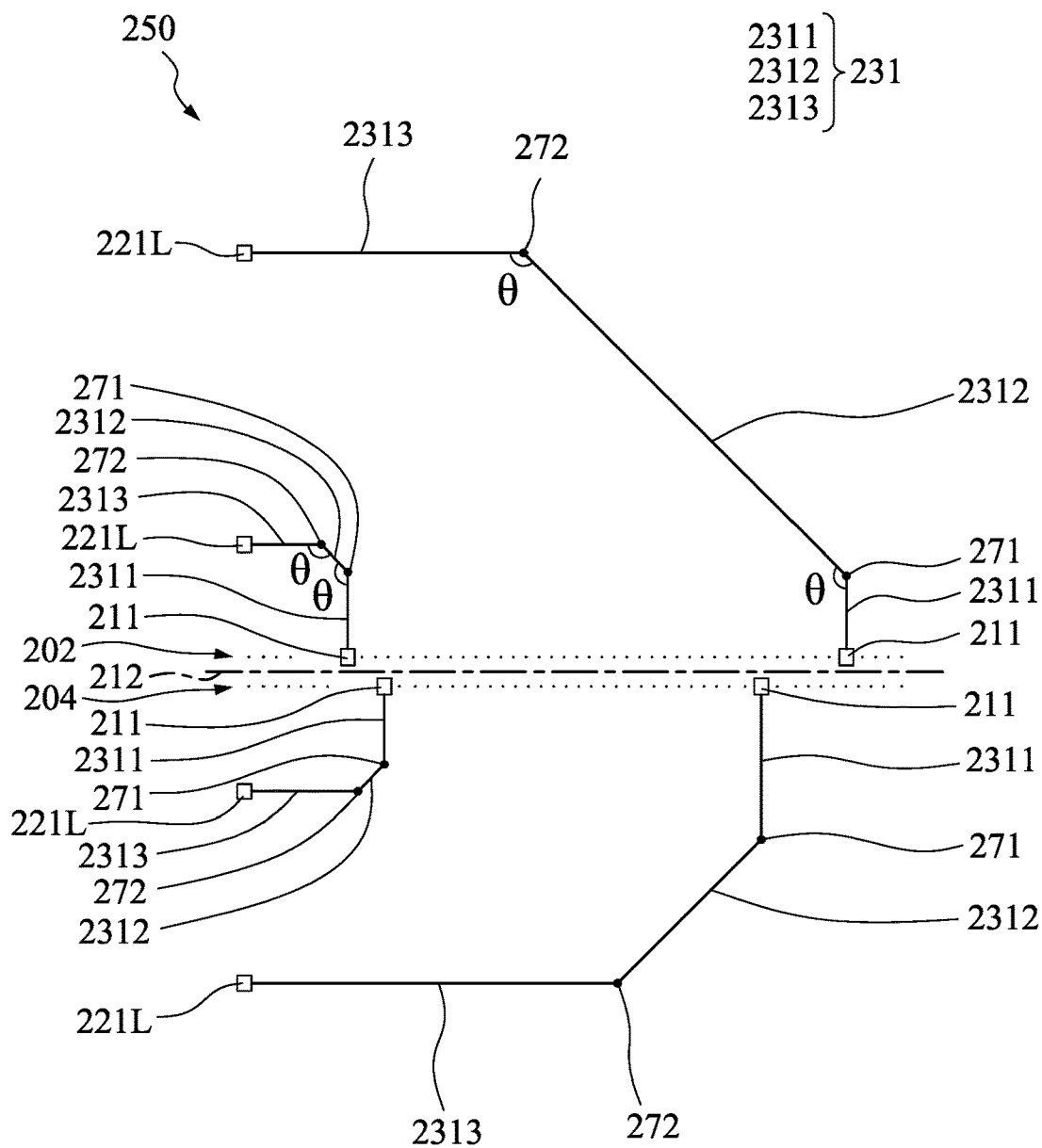
FIG. 2C is a simplified diagram illustrating the connections between the center pads and the edge pads through the conductive wires in region 250, in accordance with the embodiment of FIG. 2B.

FIG. 2A is a top view of a semiconductor device 200 in accordance with an embodiment of the present disclosure. FIG. 2B is an enlarged view of region 250 in FIG. 2A. FIG. 2C is a simplified diagram illustrating the connections between the center pads and the edge pads through the conductive wires in region 250 in accordance with the embodiment of FIG. 2B. Please refer to FIGS. 2A-2C.

In an embodiment, the semiconductor device 200 may include a variety of electrical circuits suitable for a particular application. The semiconductor device 200 may include semiconductor devices such as memories, microprocessors, application-specific integrated circuits (ASICs), or the like. In some embodiments, the semiconductor device 200 may be a dynamic random access memory (DRAM) chip.

As shown in FIG. 2A, the semiconductor device 200 may include a redistribution layer (RDL) 240 disposed thereon, and the redistribution layer 240 may include a plurality of center pads 211, a plurality of edge pads (or edge bump pads) 221L and 221R, and a plurality of conductive wires 231. For example, the plurality of center pads 211 may be disposed proximate to a center line 212 in the center region 210, wherein the center line 212 may extend along a first direction (e.g., a horizontal direction). In addition, the plurality of center pads 211 may be electrically connected to the semiconductor die (e.g., the semiconductor die 110 shown in FIG. 1, but not shown in the top view of FIG. 2A) underneath. The plurality of edge pads 221L may be disposed on an edge region 220L of the semiconductor device 200, and the plurality of edge pads 221R may be disposed on an edge region 220R of the semiconductor device 200. For brevity, a plurality of conductive wires 231 are disposed in region 230R in the right half of the semiconductor device 200, and a plurality of conductive wires 231 are disposed in region 230L in the left half of the semiconductor device 200.

It should be noted that due to the requirements of a memory protocol such as Low-Power Double Data Rate 4 (LPDDR4), the input/output bump pads of the semiconductor die of the semiconductor device 200 may be designed as the center pads 211, and signals on the center pads 211 (e.g., including power signals, ground signals, data signals, and control signals) are directed to the edge pads 221L and 221R of redistribution layer 240 by the conductive wires 231 (e.g., including power lines, ground lines, data lines, and control lines). In addition, the edge pads 221L within the edge region 220L may be spaced apart a second direction (e.g., in the vertical direction) substantially perpendicular to the first direction, and the edge pads 221R within the edge region 220R may be spaced apart the second direction (e.g., in the vertical direction) substantially perpendicular to the first direction.

Furthermore, the upper right portion, upper left portion, bottom left portion, and bottom right portion with reference to the center point 260 of FIG. 2A may be referred to as a first quadrant 291, a second quadrant 292, a third quadrant 293, and a fourth quadrant 294 of the semiconductor device 200, respectively.

Referring to FIG. 2B, the center pads 211 may be arranged into a first row 202 and a second row 204, and the first row 202 of the center pads 211 may be disposed proximate to a first side of the center line 212, and the second row 204 of the center pads 211 may be disposed proximate to a second side of the center line 212, wherein the second side is opposite to the first side. In addition, the center pads 211 in the first row 202 and the second row 204 may be interleaved, so that the gap between every two adjacent center pads 211 in the same row may allow passage therethrough of one or more conductive wires 231 corresponding to center pad 211 (i.e., between the two adjacent center pads 211) in the other row on the opposite side.

For purposes of description, a portion of the center pads 211 and the corresponding edge pads 221L are shown in FIG. 2C. The conductive wires 231 may electrically connect the center pads 211 to the edge pads 221L, as shown in FIG. 2C. Each of the conductive wires 231 may have two turning points 271 and 272. For example, the conductive wire 231 in the upper portion (i.e., above the center line 212) of FIG. 2C may include segments 2311 to 2313, where the segment 2311 is electrically connected to the corresponding center pad 211, and the segment 2313 is electrically connected to the corresponding edge pad 221L. The first turning point 271 is between the segments 2311 and 2312, and the second turning point 272 is between the segments 2312 and 2313. The inner angle θ between the segments 2311 and 2312 may be substantially equal to 135 degrees, and the inner angle θ between the segments 2312 and 2313 may also be substantially equal to 135 degrees.

Specifically, the center pads 211 in the first row and the second row within the center region 210 are spaced apart along the first direction (e.g., the horizontal direction), and the edge pads 221L and 221R in the edge region 220L and 220R are spaced apart from each other along the second direction (e.g., the vertical direction). Since each conductive wire 231 may electrically connect one of the center pads 211 to the corresponding edge pad 221L or 221R, the conductive wire 231 may be turned two times starting from the center pad 211 to the corresponding edge pad 221L or 221R, and the conductive wire 231 may be turned by a fixed angle (e.g., 135 degrees) at the first turning point 271 and the second turning point 272, so the conductive wire 231 may be substantially turned by 90 degrees to interconnect the center pad 231 to the corresponding edge pad 221L or 221R.

It should be noted that the conductive wires 231 at the same quadrant of the top view of the semiconductor device 200 may be arranged in a similar manner, and every two adjacent conductive wires 231 in the same quadrant spaced apart by a predetermined distance, so the conductive wires 231 in the same quadrant will not overlap. For example, the center pads 211 and edge pads 221 shown in FIG. 2C may be located in the second quadrant 292 and the third quadrant 293 of the top view of the semiconductor device 200.

For example, the conductive wires 231 may include power lines, ground lines, and signal lines, wherein the power lines are connected to the power supply voltage (e.g., VDD) bump pads of the semiconductor die, and the ground lines are connected to the ground bump pads (e.g., GND or VSS) of the semiconductor die, and the signal lines are connected to the signal bump pads (e.g., data (DQ1~DQ7, etc.), address, and control signals) of the semiconductor die. The aforementioned power supply voltage bump pads, ground bump pads, and signal bump pads can be collectively regarded as center pads 211. In some embodiments, the conductive wires 231 shown in FIG. 2A may have substantially the same width. In some other embodiments, the power lines and ground lines may be substantially wider than the signal lines.

Figure 3A:
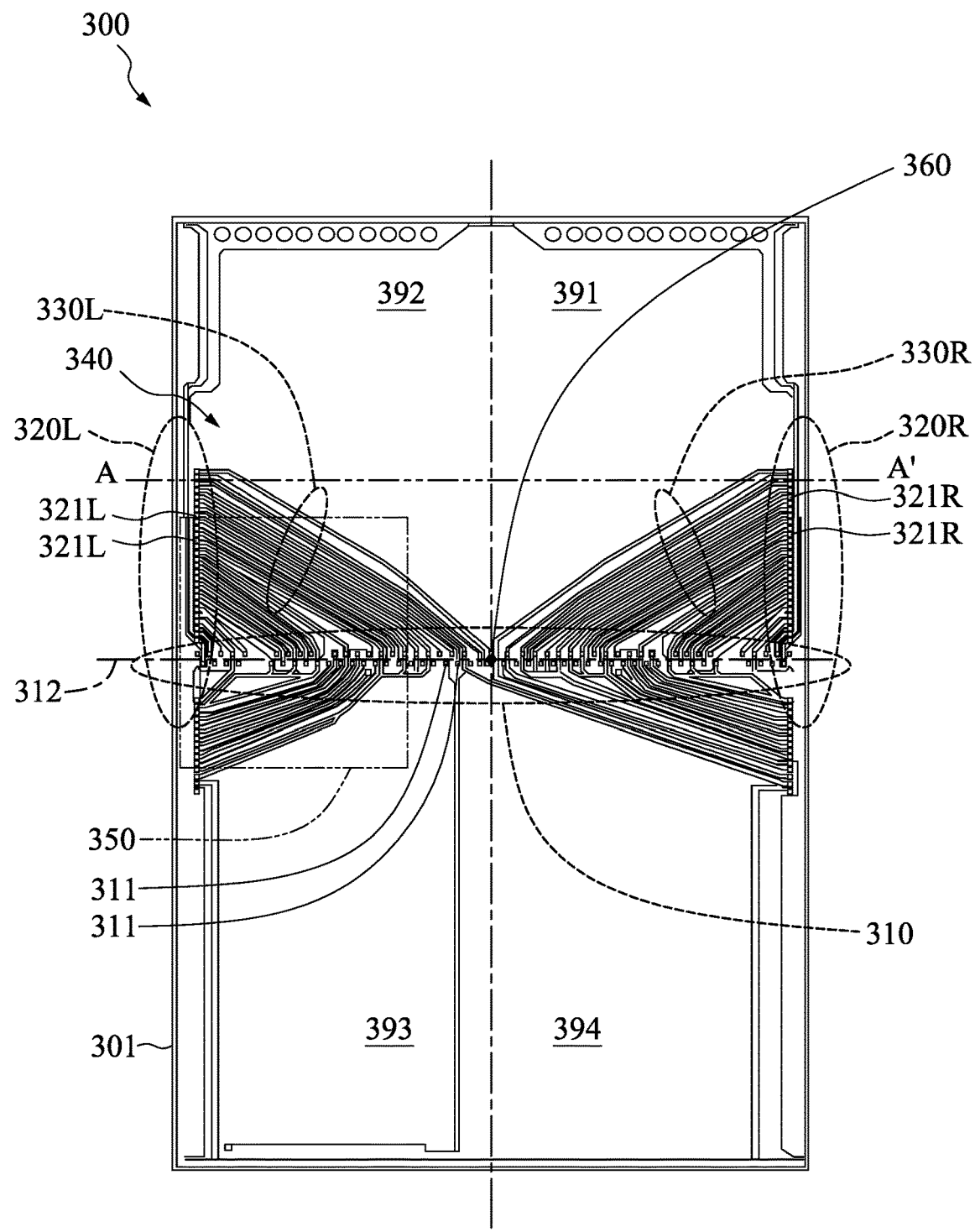
FIG. 3A is a top view of a semiconductor device 300 in accordance with another embodiment of the present disclosure.
Figure 3B:
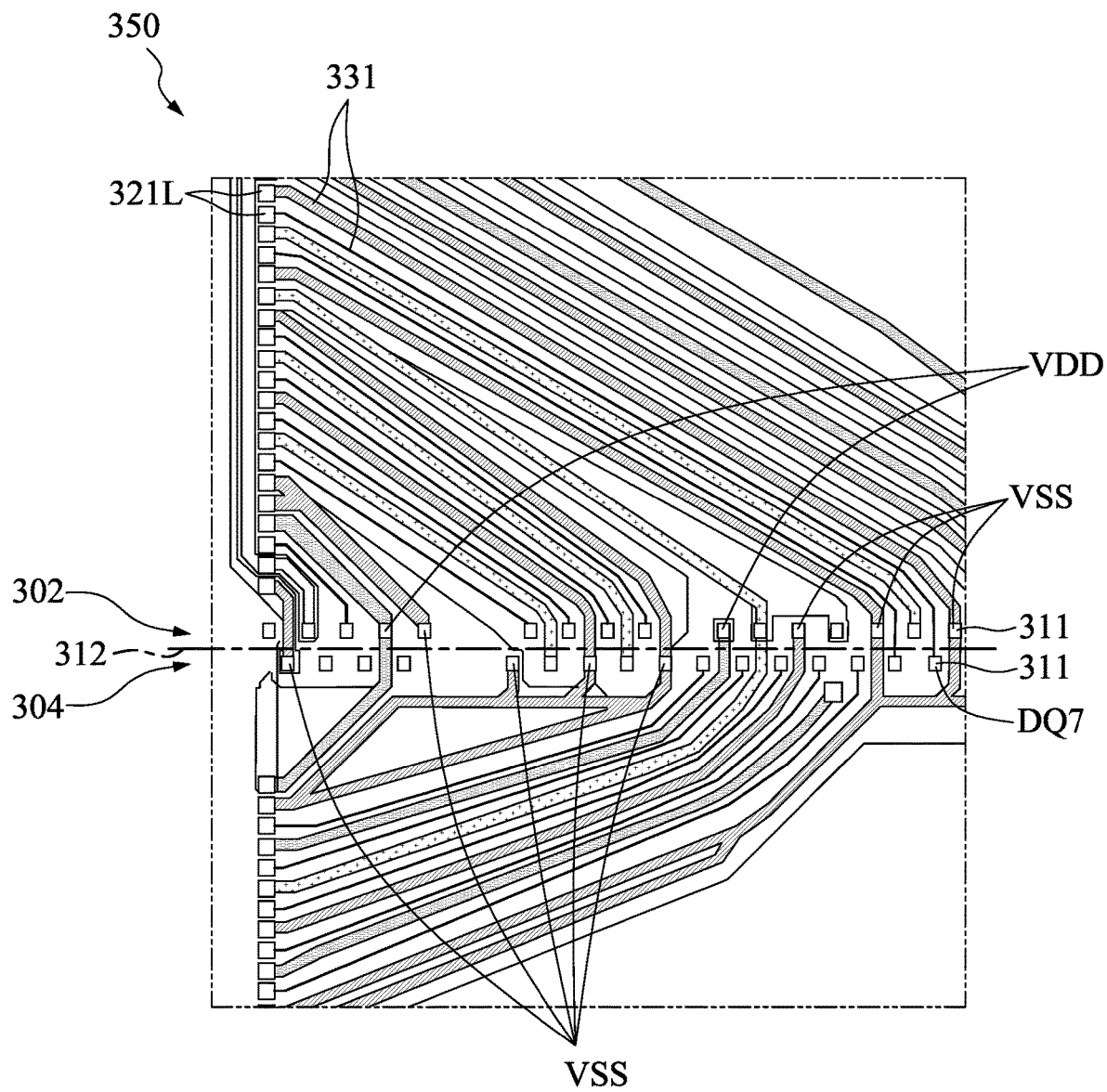
FIG. 3B is an enlarged view of region 350 in FIG. 3A.
Figure 3C:
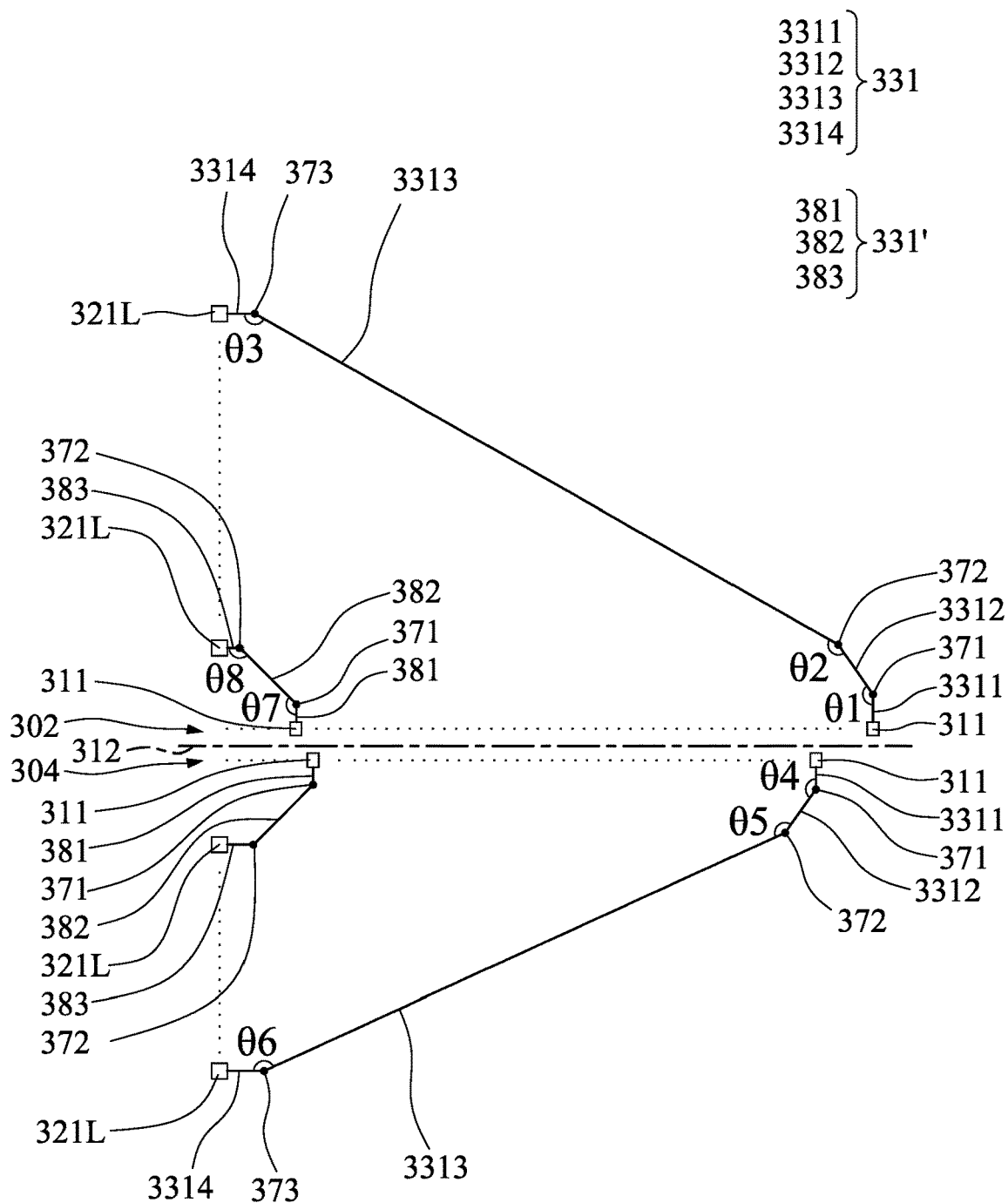
FIG. 3C is a simplified diagram illustrating the connection between the center pads and the edge pads through the conductive wires, in accordance with the embodiment of FIG. 3B.

FIG. 3A is a top view of a semiconductor device 300 in accordance with another embodiment of the present disclosure. FIG. 3B is an enlarged view of region 350 in FIG. 3A. FIG. 3C is a simplified diagram illustrating the connection between the center pads and the edge pads through the conductive wires in accordance with the embodiment of FIG. 3B. Please refer to FIGS. 3A-3C.

In an embodiment, the semiconductor device 300 may include a variety of electrical circuits suitable for a particular application. The semiconductor device 300 may include semiconductor devices such as memories, microprocessors, application-specific integrated circuits (ASICs), or the like. In some embodiments, the semiconductor device 300 may be a dynamic random access memory (DRAM) chip.

As shown in FIG. 3A, the semiconductor device 300 may include a redistribution layer (RDL) 340 disposed on the semiconductor die (not shown), and the redistribution layer 340 may include a plurality of center pads 311, a plurality of edge pads 321L and 321R, and a plurality of conductive wires 331. For example, the plurality of center pads 311 may be disposed proximate to a center line 312 in the center region 310, wherein the center line 312 may extend along a first direction (e.g., a horizontal direction). In addition, the plurality of center pads 311 may be electrically connected to the semiconductor die (e.g., the semiconductor die 110 shown in FIG. 1, but not shown in the top view of FIG. 3A) underneath. The plurality of edge pads 321L may be disposed on an edge region 320L of the semiconductor device 300, and the plurality of edge pads 321R may be disposed on an edge region 320R of the semiconductor device 300.

It should be noted that due to the timing requirements of a memory protocol such as LPDDR4, the input/output bump pads of the semiconductor die of the semiconductor device 300 may be designed as the center pads 311, and signals on the center pads 311 (e.g., including power signals, ground signals, data signals, and control signals) are directed to the edge pads 321L and 321R of the redistribution layer 340 by the conductive wires 331 (e.g., including power lines, ground lines, data signals, and control signals). In addition, the edge pads 321L within the edge region 320L may be spaced apart along a second direction (e.g., in the vertical direction) substantially perpendicular to the first direction, and the edge pads 321R within the edge region 320R may be spaced apart along the second direction (e.g., in the vertical direction) substantially perpendicular to the first direction. Furthermore, the upper right portion, upper left portion, bottom left portion, and bottom right portion with reference to the center point 360 of FIG. 3A may be referred to as a first quadrant 391, a second quadrant 392, a third quadrant 393, and a fourth quadrant 394 of the semiconductor device 200, respectively.

Referring to FIG. 3B, the center pads 311 may be arranged in a first row 302 and a second row 304, and the first row 302 of the center pads 311 may be disposed proximate to a first side of the center line 312, and the second row 304 of the center pads 311 may be disposed proximate to a second side of the center line 312, wherein the second side is opposite to the first side. In addition, the center pads 311 in the first row 302 and the second row 304 may be interleaved, so that the gap between two adjacent center pads 311 in the same row (e.g., the first row 302) may allow passage therethrough of one or more conductive wires 331 corresponding to the center pad 311 in the other row (e.g., the second row 304) on the opposite side.

For purposes of description, some of the center pads 311 and the corresponding edge pads 321L are shown in FIG. 3C. The conductive wires 331 may electrically connect the center pads 311 to the edge pads 321L, as shown in FIG. 3C. Each of the conductive wires 331 in FIG. 3A may have at least three segments and at least two turning points, depending on location thereof. For example, the conductive wire 331 on the right of the upper portion of FIG. 3C may include segments 3311 to 3314, and each of the segments 3311 to 3314 may be substantially straight. The segment 3311 is electrically connected to the corresponding center pad 311, and the segment 3314 is electrically connected to the corresponding edge pad 321L. A first turning point 371 occurs between segments 3311 and 3312, a second turning point 372 occurs between segments 3312 and 3313, and a third turning point 373 occurs between the segments 3313 and 3314. The inner angle $\theta_1$ between the segments 3311 and 3312 may be greater than 135 degrees (i.e., but smaller than 180 degrees), and the inner angle $\theta_2$ between the segments 3312 and 3313 may also be greater than 135 degrees, and the inner angle $\theta_3$ between the segments 3313 and 3314 may also be greater than 135 degrees. That is, the inner angle between every two adjacent segments of the conductive wire 331 may be within a predetermined range from 136 degrees to 179 degrees.

In addition, the conductive wire 331' on the left of the upper portion of FIG. 3C may include segments 381 to 383, and each of the segments 381 to 383 may be substantially straight. The segment 381 is electrically connected to the corresponding center pad 311, and the segment 383 is electrically connected to the corresponding edge pad 321L. The inner angles $\theta_7$ and $\theta_8$ at the turning points 371 and 372 of the conductive wire 331' may be also greater than 135 degrees, but the inner angles $\theta_7$ and $\theta_8$ may be different from the inner angles $\theta_1$-$\theta_3$ and inner angles $\theta_4$-$\theta_6$ of the conductive wires 331 on the right of FIG. 3C.

Specifically, the center pads 311 in the first row 302 in the center region 310 are spaced apart along the first direction (e.g., the horizontal direction), and the center pads 311 in the second row 304 within the center region 310 are also spaced apart along the first direction (e.g., the horizontal direction).

The edge pads 321L and 321R in the edge region 320L and 320R are respectively spaced apart along the second direction (e.g., the vertical direction). Since each conductive wire 331 may electrically connect one of the center pads 311 to the corresponding edge pad 321L or 321R, the conductive wire 331 may be turned at least two times starting from the center pad 311 to the corresponding edge pad 321L or 321R. It should be noted that the conductive wire 331 may be turned by an angle within the predetermined range at different turning points. In an embodiment, the inner angles at the first turning point 371, second turning point 372, and the third turning point 373 may be substantially the same to form the routing path of the conductive wire 331. In another embodiment, all or a portion of the inner angles at the first turning point 371, second turning point 372, and the third turning point 373 may be different, depending on the locations of the center pad 311 and edge pad 321L or 321R corresponding thereto.

In yet another embodiment, the inner angle between two adjacent segments of the conductive wire 331 may be dependent on the location of the center pad 311 associated with the conductive wire 331. For example, proximity of the center pad 311 to a left edge 301 of the semiconductor device 300 indicates that the edge pad 321L corresponding to the center pad 311 may be proximate to the center line 312, and the conductive wire 331 associated with the center pad 311 is shorter. Therefore, the inner angle at each turning point of the conductive wire 331 may be relatively less, but it is still greater than 135 degrees, as shown in FIG. 3B.

In addition, proximity of the center pad 311 to the center 360 of the semiconductor device 300 indicates that the edge pad 321L or 321R corresponding to the center pad 331 may be farther from the center line 312, and the conductive wire 331 associated with the center pad 311 is longer. Therefore, the inner angle at each turning point of the conductive wire 331 may be relatively larger, as shown in FIG. 3B.

It should be noted that the conductive wires 331 at the same quadrant of the top view of the semiconductor device 300 may be arranged in a similar manner, and every two adjacent conductive wires 331 in the same quadrant spaced apart by a predetermined distance, so the conductive wires 331 in the same quadrant do not overlap. For example, the center pads 311 and edge pads 321 shown in FIG. 3C may be located in the second quadrant 392 and the third quadrant 393 of the top view of the semiconductor device 300.

As an example, the conductive wires 331 may include power lines, ground lines, and signal lines, wherein the power lines are connected to the power supply voltage (e.g., VDD) bump pads of the semiconductor die, the ground lines are connected to the ground bump pads (e.g., GND or VSS) of the semiconductor die, and the signal lines are connected to the signal bump pads (e.g., data (DQ1~DQ7, etc.), address, and control signals) of the semiconductor die. The aforementioned power supply voltage bump pads, ground bump pads, and signal bump pads can be collectively regarded as center pads 311. In some embodiments, the conductive wires 331 shown in FIG. 3A may be substantially the same width. In some other embodiments, the width of the power lines and ground lines may be greater than that of the signal lines. For brevity, a plurality of conductive wires 331 are disposed in region 330R in the right half of the semiconductor device 300, and a plurality of conductive wires 331 are disposed in region 330L in the left half of the semiconductor device 300.

In an embodiment, given that the semiconductor device 300 is an LPDDR4 memory chip, there may be 8 data pads (e.g., DQ0 to DQ7) among the center pads 311 located in the left portion of the semiconductor device 300. The center pad 311 of the data signal DQ7 may be disposed proximate to the center 360 in FIG. 3A while the center pad 311 of the data signal DQ0 may be disposed farther from the center 360. The first lengths of the conductive wires 331 electrically connecting the center pads 311 of the data signals DQ0 to DQ7 to the corresponding edge pads 321L are shown in the second column of Table 1.

In addition, given that the semiconductor device 200 is an LPDDR4 memory chip, 8 data pads (e.g., DQ0 to DQ7) may be disposed among the center pads 211 in the left portion of the semiconductor device 200. The center pad 211 of the data signal DQ7 may be disposed proximate to the center 260 in FIG. 2A while the center pad 211 of the data signal DQ0 may be disposed farther from the center 260. The second lengths of the conductive wires 231 electrically connecting the center pads 211 of the data signals DQ0 to DQ7 are shown in the third column of Table 1.

Table 1 illustrates the net name of the data signals, the lengths of the conductive wires 331 corresponding to the data signals DQ0 to DQ7, the lengths of the conductive wires 231 corresponding to the data signals DQ0 to DQ7, and the difference between the first lengths and the second lengths in the second column and the third column.

TABLE 1

| Net Name | First Length (μm) | Second Length (μm) | Difference (μm) |
| --- | --- | --- | --- |
| DQ0 | 1350.95 | 1568.98 | −218.03 |
| DQ1 | 1530.75 | 1767.93 | −237.18 |
| DQ2 | 1699.55 | 1971.39 | −271.84 |
| DQ3 | 1870.03 | 2174.79 | −304.76 |
| DO4 | 2229.35 | 2168.02 | 61.33 |
| DQ5 | 2421.60 | 2372.33 | 49.27 |
| DQ6 | 2668.26 | 2899.82 | −231.56 |
| DQ7 | 2853.65 | 3133.05 | −279.4 |

Referring to Table 1, the conductive wire 331 for the data signal DQ7 is shorter than the respective conductive wire 221 by −279.4 μm, approximately 14% shorter. The conductive wires 331 for the data signals may be approximately 9% to 14% shorter than the conductive wires 231 for the data signals, except for data signals DQ4 and DQ5. Therefore, in comparison with the redistribution layer 240 of the semiconductor device 200 shown in FIG. 2A, the conductive wires 331 of the redistribution layer 340 shown in FIG. 3A can electrically connect the center pads 311 to the edge pads 321L or 321R using shorter routing paths, thereby improving the response speed of the semiconductor device operating at a high clock frequency.

Figure 4:
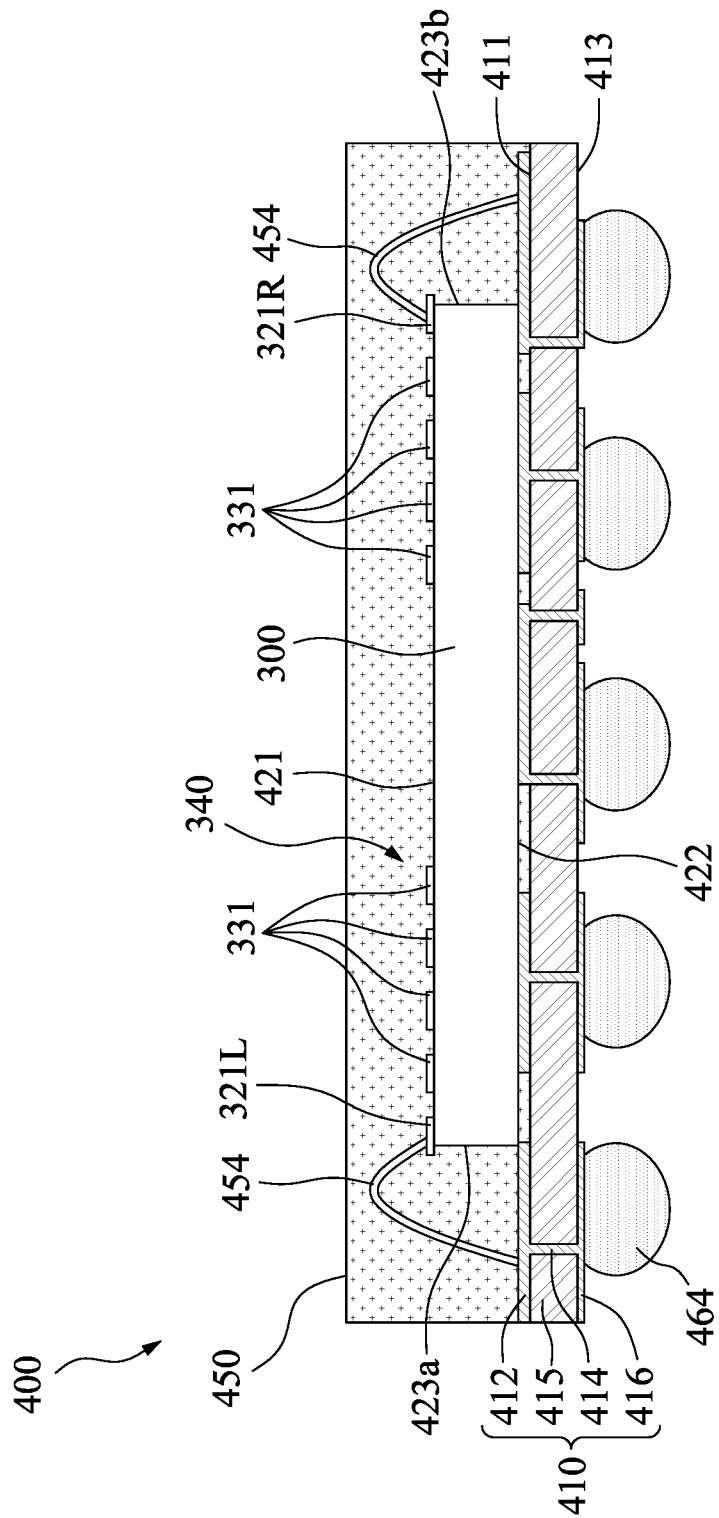
FIG. 4 is a cross-sectional view of a semiconductor structure 400, in accordance with an embodiment of the present disclosure.

FIG. 4 is a cross-sectional view of a semiconductor structure 400 in accordance with an embodiment of the present disclosure. Please refer to FIG. 3A and FIG. 4.

In an embodiment, the semiconductor structure 400 shown in FIG. 4 may include a substrate 410 and the cross-section of the semiconductor device 300 along line AA' shown in FIG. 3A. In some embodiments, the substrate 410 may include a core layer 415, which is quadrilateral, rectangular, square, polygonal, or any other suitable shape. In some embodiments, the core layer 415 is a semiconductor substrate. The core layer 415 may include an elementary semiconductor, such as germanium, or silicon; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the core layer 415 includes a material such as ceramic, glass or the like.

In some embodiments, the core layer 415 is fabricated with a predetermined functional circuit thereon. The substrate 410 may further include a conductive trace 412 extending above the first surface 411 of the substrate 410. The conductive trace 412 may be made of copper, tungsten, aluminum, palladium, alloys thereof, or other suitable materials.

The semiconductor device 300 may be disposed above the first surface 411 of the substrate 410. In some embodiments, the semiconductor device 300 includes a variety of electrical circuits suitable for a particular application. The semiconductor device 300 may include semiconductor devices such as memories, microprocessors, application-specific integrated circuits (ASICs), or the like. In some embodiments, the semiconductor device 300 is a dynamic random access memory (DRAM) chip.

In some embodiments, the semiconductor device 300 has a front side 421 (e.g., a top surface), a back side 422 (e.g., a bottom surface) opposite to the front side 421, and opposite sidewalls 423a and 423b. The sidewalls 423a and 423b connect the front side 421 and the back side 422 such that the front side 421, the back side 422, and the sidewalls 423a and 423b form an exterior boundary of the semiconductor device 300. In addition, the semiconductor device 300 is bonded above the substrate 410 by an adhesive material such as a glue or the like. For example, the adhesive material is in contact with the back side 422 of the semiconductor device 300 and the conductive trace 412 of the substrate 410.

The front side 421 of the semiconductor device 300 faces upward, as shown in FIG. 4, and the redistribution layer (RDL) 340 shown in FIG. 3A, which includes the conductive wires 331, is disposed on the front side 421 of the semiconductor device 300 for directing the center pads (not shown in FIG. 4) to the edge pads 421R and 421E of the semiconductor device 300.

In some embodiments, the semiconductor structure 400 may include a molding compound 450 above the substrate 410 and covers the RDL 340. In detail, the molding compound is disposed above the first surface 411 of the substrate 410 and covers (or encapsulates) the semiconductor device 300. In some embodiments, the molding compound 450 is disposed above the conductive trace 412 of the substrate 410, and a sidewall of the conductive trace 412 is exposed. For example, the molding compound 450 can be a single-layer film or a composite stack. The molding compound 250 may include various materials, such as molding compound, molding compound underfill, epoxy, resin, or the like. In some embodiments, the molding compound 450 has a high thermal conductivity, a low moisture absorption rate, and/or a high flexural strength.

In some embodiments, the substrate 410 further includes a conductive trace 416 extending on the second surface 413 of the substrate 410 and a plurality of conductive vias 414 extending through the substrate 410. The conductive vias 414 may interconnect the conductive traces 412 and 416. The conductive vias 414 may be made of gold, silver, copper, nickel, tungsten, aluminum, palladium, alloys thereof, or other suitable materials.

In some embodiments, the semiconductor structure 400 further includes conductive bumps 464 on the second surface 413 of the substrate 410. The conductive bump 464 may include conductive material such as solder, copper, nickel, or gold. In some embodiments, each of the conductive bumps 464 is a solder ball, a ball grid array (BGA) ball, controlled collapse chip connection (C4) bump, microbump, a pillar or the like. In some embodiments, the conductive bump 464 is spherical, hemispherical, or cylindrical.

In an embodiment, signals of one center pad 311 of the semiconductor device 300 in the second quadrant 392 and the third quadrant 393 shown in FIG. 3A can be electrically connected to one of the conductive bumps 464 through the conductive wires 331 of the redistribution layer 340, the edge pad 321L, the bonding wire 454, the conductive trace 412, and the conductive via 414. Similarly, signals of another center pad 311 of the semiconductor device 300 in the first quadrant 391 and the fourth quadrant 394 shown in FIG. 3A can be electrically connected to another of the conductive bumps 464 through the conductive wires 331 of the redistribution layer 340, the edge pad 321R, the bonding wire 454, the conductive trace 412, and the conductive via 414. The materials of the bonding wires 454 may be aluminum, copper, silver, gold, alloyed aluminum, etc., but the present disclosure is not limited thereto.

Figure 5:
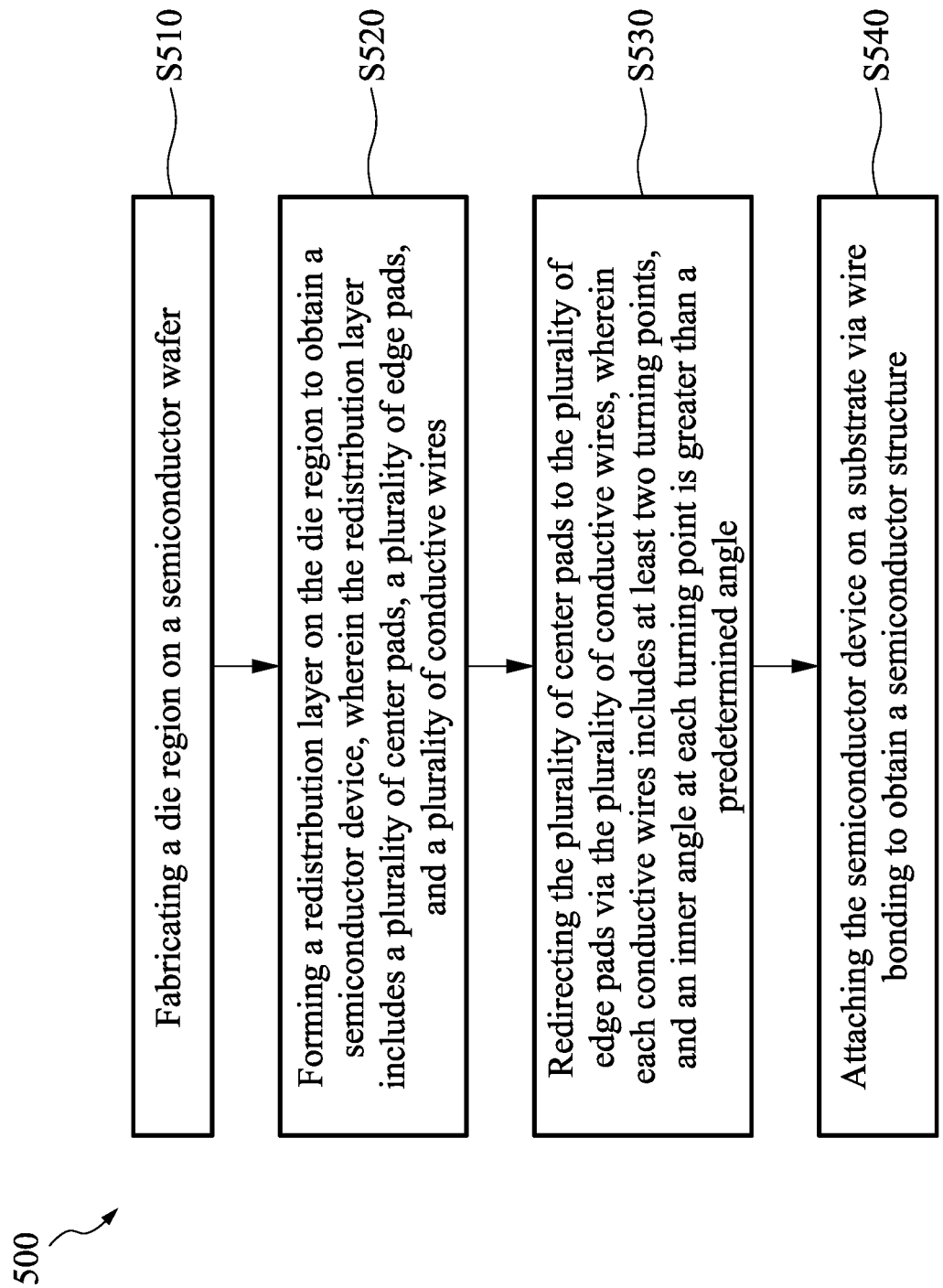
FIG. 5 is a flowchart of a method 500 for arranging a redistribution layer of a semiconductor device in accordance with an embodiment of the present disclosure.

FIG. 5 is a flowchart of a method 500 for arranging a redistribution layer of a semiconductor device in accordance with an embodiment of the present disclosure. Please refer to FIGS. 3A-3C, FIG. 4, and FIG. 5.

In step S510, a semiconductor die 110 is fabricated on a semiconductor wafer 1. For example, a single semiconductor wafer 1 may include hundreds or thousands of copies of the same semiconductor die 110. These semiconductor dies 110 on the semiconductor wafer 1 are separated by a "dicing" process on the scribe line region 121 of the semiconductor wafer 1, wherein each of the semiconductor dies 110 may include functional circuitry, and the scribe line region 121 may be a non-functional region.

In step S520, a redistribution layer 340 is formed on a top surface of the semiconductor die 110, wherein the redistribution layer 340 includes a plurality of center pads 311, a plurality of edge pads 321L and 321R, and a plurality of conductive wires 331. For example, the plurality of center pads 311 may be disposed proximate to a center line 312 in the center region 310, wherein the center line 312 may extend along a first direction (e.g., a horizontal direction). In addition, the plurality of center pads 311 may be electrically connected to the semiconductor die (e.g., the semiconductor die 110 shown in FIG. 1, but not shown in the top view of FIG. 3A) underneath. The plurality of edge pads 321L may be disposed on an edge region 320L of the semiconductor device 300, and the plurality of edge pads 321R may be disposed on an edge region 320R of the semiconductor device 300.

In step S530, the plurality of center pads are redirected to the plurality of edge pads via the plurality of conductive wires 331, wherein each conductive wire 331 includes at least two turning points, and an inner angle at each turning point is greater than a predetermined angle. For example, each of the conductive wires 331 in FIG. 3A may have at least three segments and at least two turning points, depending on its location.

In step S540, the semiconductor device 300 is attached on a substrate 410 via wire bonding to obtain a semiconductor device 400. For example, the bonding wires 454 may be used to electrically connect the edge pads 321L and 321R to the substrate 410. The materials of the bonding wires 454 may be one of aluminum, copper, silver, gold, alloyed aluminum, etc., but the present disclosure is not limited thereto.

In view of the embodiment in FIG. 5, the conductive wires 331 of the redistribution layer 340 formed on the semiconductor die 110 can electrically connect the center pads 311 to the edge pads 321L or 321R using a shorter routing path, thereby improving the response speed of the semiconductor device operating at a high clock frequency.

The method 500 is merely an example, and is not intended to limit the present disclosure beyond what is explicitly recited in the claims. Additional operations can be provided before, during, or after each operation of the method 500, and some operations described can be replaced, eliminated, or reordered for additional embodiments of the method. In some embodiments, the method 500 can include further operations not depicted in FIG. 5.

One aspect of the present disclosure provides a semiconductor device which includes a semiconductor die and a redistribution layer. The redistribution layer is formed on the semiconductor die, and includes a plurality of center pads, a plurality of edge pads, and a plurality of conductive wires electrically connecting the plurality of center pads to the plurality of edge pads. Each of the plurality of conductive wires comprises at least two turning points, and an inner angle at each turning point is greater than a predetermined angle.

In some embodiments, the center pads are arranged in a first row and a second row proximate to a center line in a center region of the semiconductor device, and the center line extends along a first direction. In addition, the center pads in the first row and the second row are interleaved.

In some embodiments, the edge pads are disposed in a first edge region and a second edge region of the semiconductor device, and the second edge region is opposite to the first edge region. In addition, the edge pads disposed in the first edge region and the second edge region are spaced apart along a second direction, and the second direction is substantially perpendicular to the first direction.

In some embodiments, each conductive wire comprises a first segment, a second segment, and a third segment, and the at least two turning points comprise a first turning point and a second turning point, wherein the first turning point is between the first segment and the second segment, and the second turning point is between the second segment and the third segment.

In some embodiments, a first inner angle at the first turning point is substantially equal to a second inner angle at the second turning point. Alternatively, a first inner angle at the first turning point is different from a second inner angle at the second turning point.

In some embodiments, the conductive wires comprise power lines, ground lines, and signal lines, and a first width of the conductive wires and the ground lines is greater than a second width of the signal lines.

In some embodiments, the predetermined angle is between 136 degrees and 179 degrees.

Another aspect of the present disclosure provides a semiconductor structure, which includes a substrate, a semiconductor device, and a plurality of bonding wires. The substrate has a first surface and a conductive trace extending above the substrate. The semiconductor device is disposed on the first surface of the substrate, and includes a semiconductor die and a redistribution layer. The redistribution layer is formed on the semiconductor die to obtain a semiconductor device, and includes a plurality of center pads, a plurality of edge pads, and a plurality of conductive wires electrically connecting the plurality of center pads to the plurality of edge pads. The plurality of bonding wires are electrically connected between the substrate and the plurality of edge pads. Each of the plurality of conductive wires comprises at least two turning points, and an inner angle at each turning point is greater than a predetermined angle.

In some embodiments, the center pads are arranged in a first row and a second row proximate to a center line in a center region of the semiconductor device, and the center line extends along a first direction. In addition, the center pads in the first row and the second row are interleaved.

In some embodiments, the edge pads are disposed in a first edge region and a second edge region of the semiconductor device, and the second edge region is opposite to the first edge region. In addition, the edge pads disposed in the first edge region and the second edge region are spaced apart along a second direction, and the second direction is substantially perpendicular to the first direction.

In some embodiments, each conductive wire comprises a first segment, a second segment, and a third segment, and the at least two turning points comprise a first turning point and a second turning point. The first turning point is between the first segment and the second segment, and the second turning point is between the second segment and the third segment.

In some embodiments, a first inner angle at the first turning point is substantially equal to a second inner angle at the second turning point. Alternatively, a first inner angle at the first turning point is different from a second inner angle at the second turning point.

In some embodiments, the conductive wires comprise power lines, ground lines, and signal lines, and a first width of the conductive wires and the ground lines is greater than a second width of the signal lines.

In some embodiments, the predetermined angle is between 136 degrees and 179 degrees.

In some embodiments, the plurality of bonding wires comprises a plurality of first bonding wires and a plurality of second bonding wires, and the plurality of first bonding wires are electrically connected between the edge pads in the first edge region and the substrate, and the plurality of second bonding wires are electrically connected between the edge pads in the second edge region and the substrate.

In some embodiments, the semiconductor structure further includes a molding compound, disposed above the first surface of the substrate and covering the semiconductor device.

In some embodiments, the semiconductor structure further includes a conductive bump disposed on a second surface of the substrate, wherein the second surface is opposite to the first surface.

Yet another aspect of the present disclosure provides a method for arranging a redistribution layer of a semiconductor device. The method includes the following steps: fabricating a semiconductor die on a semiconductor wafer; forming a redistribution layer on a top surface of the semiconductor die, wherein the redistribution layer comprises a plurality of center pads and a plurality of edge pads; and redirecting the plurality of center pads to the plurality of edge pads via a plurality of conductive wires of the redistribution layer. Each conductive wire includes at least two turning points, and an inner angle at each turning point is greater than a predetermined angle.

In some embodiments, the method further includes: arranging the center pads in a first row and a second row proximate to a center line in a center region of the semiconductor device, wherein the center line extends along a first direction.

In some embodiments, the method further includes interleaving the center pads in the first row and the second row.

In some embodiments, the edge pads are disposed in a first edge region and a second edge region of the semiconductor device, and the second edge region is opposite to the first edge region.

In some embodiments, the edge pads disposed in the first edge region and the second edge region are spaced apart along a second direction, and the second direction is substantially perpendicular to the first direction.

In some embodiments, each conductive wire comprises a first segment, a second segment, and a third segment. The at least two turning points comprise a first turning point and a second turning point, wherein the first turning point is between the first segment and the second segment, and the second turning point is between the second segment and the third segment.

In some embodiments, a first inner angle at the first turning point is substantially equal to a second inner angle at the second turning point. Alternatively, a first inner angle at the first turning point is different from a second inner angle at the second turning point.

In some embodiments, the predetermined angle is between 136 degrees and 179 degrees.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A semiconductor device, comprising:
    a semiconductor die; and
    a redistribution layer, formed on a top surface of the semiconductor die, the redistribution layer comprising:
        a plurality of center pads;
        a plurality of edge pads; and
        a plurality of conductive wires, electrically connecting the plurality of center pads to the plurality of edge pads respectively;
    wherein each of the plurality of conductive wires comprises at least two turning points, and an inner angle at each turning point is between 135 degrees and 179 degrees;
    wherein each of the plurality of conductive wires is turned at a same angular direction at each of the inner angles from one of the center pads to the corresponding edge pad.

2. The semiconductor device of claim 1, wherein the center pads are arranged in a first row and a second row proximate to a center line in a center region of the semiconductor device, and the center line extends along a first direction.

3. The semiconductor device of claim 2, wherein the center pads in the first row and the second row are interleaved, such that the center pads in the first row are not aligned with the center pads in the second row in a second direction which is perpendicular to the first direction.

4. The semiconductor device of claim 3, wherein the edge pads are disposed in a first edge region and a second edge region of the semiconductor device, and the second edge region is opposite to the first edge region.

5. The semiconductor device of claim 4, wherein the edge pads disposed in the first edge region and the second edge region are spaced apart along the second direction.

6. The semiconductor device of claim 1, wherein each conductive wire comprises a first segment, a second segment, and a third segment, and the at least two turning points comprise a first turning point and a second turning point,
wherein the first turning point is between the first segment and the second segment, and the second turning point is between the second segment and the third segment;
wherein an angular direction between the first segment and the second segment at the first turning point is equal to an angular direction between the second segment and the third segment at the second turning point.

7. The semiconductor device of claim 6, wherein a first inner angle at the first turning point is substantially equal to a second inner angle at the second turning point.

8. The semiconductor device of claim 6, wherein a first inner angle at the first turning point is different from a second inner angle at the second turning point.

9. The semiconductor device of claim 1, wherein the conductive wires comprises power lines, ground lines, and signal lines, and a first width of the power lines and the ground lines is greater than a second width of the signal lines.

10. The semiconductor device of claim 1, wherein the center pads and the edge pads are bump pads and are identical with each other.

11. A method for arranging a redistribution layer of a semiconductor device, the method comprising:
fabricating a semiconductor die on a semiconductor wafer;
forming a redistribution layer on a top surface of the semiconductor die to obtain a semiconductor device, wherein the redistribution layer comprises a plurality of center pads, a plurality of edge pads, and a plurality of conductive wires; and
redirecting the plurality of center pads to the plurality of edge pads via the plurality of conductive wires, wherein each conductive wire includes at least two turning points, and an inner angle at each turning point is between 135 degrees and 179 degrees;
wherein each of the plurality of conductive wires is turned at a same angular direction at each of the inner angles from one of the center pads to the corresponding edge pad.

12. The method of claim 11, further comprising: arranging the center pads in a first row and a second row proximate to a center line in a center region of the semiconductor device, wherein the center line extends along a first direction.

13. The method of claim 12, further comprising: interleaving the center pads in the first row and the second row, wherein the center pads in the first row are not aligned with the center pads in the second row in a second direction which is perpendicular to the first direction.

14. The method of claim 13, wherein the plurality of edge pads are disposed in a first edge region and a second edge region of the semiconductor device, and the second edge region is opposite to the first edge region.

15. The method of claim 14, wherein the plurality of edge pads disposed in the first edge region and the second edge region are spaced apart along the second direction.

16. The method of claim 11, wherein each conductive wire comprises a first segment, a second segment, and a third segment, and the at least two turning points comprise a first turning point and a second turning point,
wherein the first turning point is between the first segment and the second segment, and the second turning point is between the second segment and the third segment;
wherein an angular direction between the first segment and the second segment at the first turning point is equal to an angular direction between the second segment and the third segment at the second turning point.

17. The method of claim 14, wherein a first inner angle at the first turning point is substantially equal to a second inner angle at the second turning point.

18. The method of claim 14, wherein a first inner angle at the first turning point is different from a second inner angle at the second turning point.

19. The method of claim 11, wherein the center pads and the edge pads are bump pads and are identical with each other.

* * * * *